United States Patent
Desai et al.

(10) Patent No.: US 8,633,787 B2
(45) Date of Patent: Jan. 21, 2014

(54) COUPLED MEMS STRUCTURE FOR MOTION AMPLIFICATION

(75) Inventors: Shahyaan Desai, Ithaca, NY (US); Anil N. Netravali, Ithaca, NY (US); Michael O. Thompson, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 794 days.

(21) Appl. No.: 12/442,369

(22) PCT Filed: Sep. 21, 2007

(86) PCT No.: PCT/US2007/020501
§ 371 (c)(1),
(2), (4) Date: Aug. 12, 2010

(87) PCT Pub. No.: WO2008/039378
PCT Pub. Date: Apr. 3, 2008

(65) Prior Publication Data
US 2010/0295414 A1    Nov. 25, 2010

Related U.S. Application Data

(60) Provisional application No. 60/846,531, filed on Sep. 22, 2006.

(51) Int. Cl.
*H03H 9/24* (2006.01)
*H03H 9/50* (2006.01)
*G01P 15/08* (2006.01)

(52) U.S. Cl.
USPC ......... 333/186; 73/504.15; 333/197; 310/309

(58) Field of Classification Search
USPC ............... 333/186, 197; 310/309; 73/504.04, 73/504.12, 504.13, 504.14, 504.15
See application file for complete search history.

(56) References Cited

U.S. PATENT DOCUMENTS

| | | | |
|---|---|---|---|
| 4,785,215 A | | 11/1988 | Blech |
| 5,390,867 A | * | 2/1995 | Zhang et al. .............. 242/597 |
| 5,481,142 A | * | 1/1996 | James et al. .............. 310/51 |
| 5,862,003 A | * | 1/1999 | Saif et al. ................. 359/871 |
| 6,175,170 B1 | * | 1/2001 | Kota et al. ............ 310/40 MM |
| 6,290,037 B1 | * | 9/2001 | Williams et al. ........... 188/379 |
| 6,293,148 B1 | * | 9/2001 | Wang et al. ............. 73/504.02 |
| 6,393,913 B1 | * | 5/2002 | Dyck et al. ............. 73/504.12 |
| 6,748,818 B2 | * | 6/2004 | Jensen et al. .............. 74/470 |

(Continued)

FOREIGN PATENT DOCUMENTS

WO    WO-2008039378 A2    4/2008
WO    WO-2008039378 A3    4/2008

OTHER PUBLICATIONS

"International Application Serial No. PCT/US2007/020501, International Search Report mailed Apr. 1, 2008", 2 pgs.

(Continued)

*Primary Examiner* — Barbara Summons
(74) *Attorney, Agent, or Firm* — Schwegman, Lundberg & Woessner, P.A.

(57) ABSTRACT

A microelectromechanical structure (MEMS) device includes a secondary MEMS element displaceably coupled to a substrate. A primary MEMS element is displaceably coupled to the secondary MEMS element and has a resonant frequency substantially equal to the secondary MEMS element and has a much larger displacement than the secondary MEMS element.

16 Claims, 2 Drawing Sheets

(56) References Cited

U.S. PATENT DOCUMENTS

| | | | |
|---|---|---|---|
| 6,845,669 B2 * | 1/2005 | Acar et al. | 73/504.14 |
| 6,928,874 B2 * | 8/2005 | Painter et al. | 73/504.13 |
| 7,484,410 B2 * | 2/2009 | Tsuji et al. | 73/504.04 |
| 7,592,263 B2 * | 9/2009 | Gouda et al. | 438/719 |

OTHER PUBLICATIONS

"international Application Serial No. PCT/US2007/020501, Written Opinion mailed Apr. 1, 2008", 6 pgs.

* cited by examiner

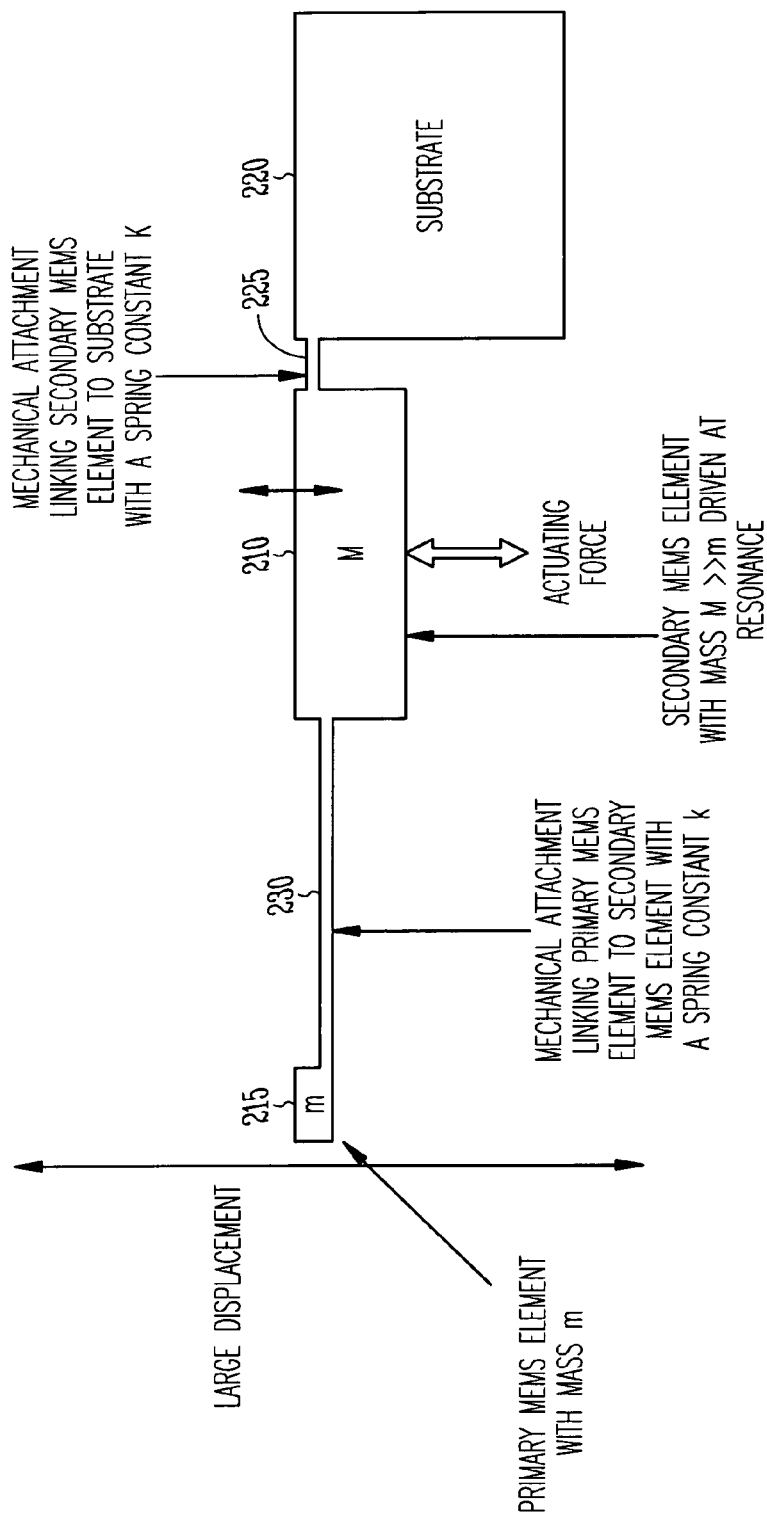

COUPLED MEMS STRUCTURE FOR MOTION AMPLIFICATION

CROSS REFERENCE TO RELATED APPLICATION

The present application claims the benefit of U.S. Provisional Application No. 60/846,531, filed on Sep. 22, 2006. The content of the aforementioned application is fully incorporated by reference herein.

BACKGROUND

Microelectromechanical structures (MEMS) are very small mechanical structures, usually formed using semiconductor processing processes. Such structures may be formed as resonators, and used as sensors, and vibrate in response to a sensed parameter or applied force. The displacement of such vibrations are generally very small, since the MEMS structure itself is generally very small, in the range of micrometer to nanometers. There is a need for a MEMS structure that provides a larger displacement in response to small forces.

Presently, there is a need in micro-electromechanical technology for a resonator that is capable of large motions at low drive voltages. Large, linear displacements are obtained by using comb drive actuation, however the force of a comb drive is low and large drive voltages, and numbers of comb teeth are needed. Parallel-plate drive actuation generates larger forces over a comparable area, however the displacement is limited because the force is nonlinear. Magnetic actuation produces large forces, but is limited to low frequency, and requires heavy electroplated ferromagnetic materials. Lorentz coil actuation similarly faces inductance limits and requires substantial currents and hence high power levels.

BRIEF DESCRIPTION OF THE DRAWINGS

FIG. 2 is a block diagram cross section representation of a dual displacement MEMS element according to an example embodiment.

DETAILED DESCRIPTION

Figure 1:
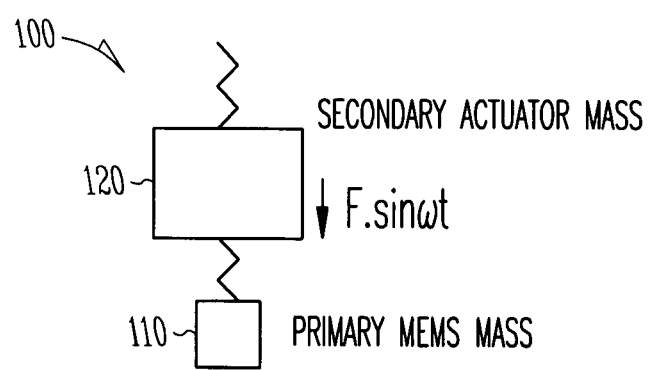
FIG. 1 a block diagram illustration of an absorber spring-mass system according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A dual-mass oscillator system indicated at 100 in FIG. 1, has a primary element 110 (or mass) coupled to a more massive secondary element 120 (mass). The elements are designed or adapted to oscillate with the same resonant frequency, providing a large displacement with little applied force.

The dual-mass oscillator system 100 is arranged as an absorber spring-mass system in which a low mass primary MEMS element 110 is attached to a more massive secondary structure (actuator) 120 which is forced to vibrate at a desired frequency. In one embodiment, the resonant frequency of the primary mass 110 is tuned to the frequency at which the secondary mass 120 is vibrated. Such tuning results in the vibrations of the secondary more massive structure 120 ceasing, with the primary mass 110 acting to absorb all the vibration energy, acting like a tuned vibration absorber. Consequently, if the system 100 is designed so that the resonance frequency of the primary mass (or MEMS element) is tuned to match that of the secondary more massive MEMS structure to which it is coupled, and if the secondary MEMS structure is forced to vibrate with the resonance frequency shared by both structures, then very large displacements at very low power may be provided from the primary, less massive MEMS structure. The secondary, more massive MEMS element may be actuated using any of the methods currently known and used in the MEMS field, as well as those developed in the future. Typical actuation methods include piezoelectric, electrostatic, electromagnetic, thermal and other means.

In one embodiment illustrated in FIG. 2, two MEMS structures having substantially the same resonant frequency are coupled to each other to provide an increased displacement in response to force. One example includes a secondary MEMS element 210 that is coupled to a primary MEMS element 215. The elements may be cantilevers in one embodiment. The secondary element 210 is designed to have a natural frequency substantially equal to that of the primary element 215 by controlling the elements' shape, mass and spring stiffness. By forcing the secondary element 210 to vibrate through small displacements using electrostatic, electromagnetic, piezoelectric forces or other methods, much larger displacements may be provided in the primary MEMS element 215 at moderate to low power levels.

In one embodiment, the secondary element 210 is coupled to a substrate 220 by a secondary cantilever arm 225. Arm 225 provides an attachment linking the secondary MEMS element to the substrate 220 with a spring constant of K. Secondary element 210 has a mass of M. A primary cantilever arm 230 provides mechanical attachment linking the primary element 215 to the secondary element 210. The primary element 215 has a mass of m, and the primary arm 230 has a spring constant of k. To substantially match the resonant frequencies of both structures, the ratio of k/m is equal to K/M. In one embodiment, the substrate is a semiconductor material such as silicon or silicon carbide, and the structures may be formed of the same material. The substrate need not be a semiconductor material, but should provide sufficient mass to firmly support the structures.

The elements and arms may be formed using common semiconductor processing steps, such as masking and etching techniques, and may be formed of many different materials having desirable characteristics to provide resonators with desired life times, resonant frequencies and displacements. In one embodiment, the mass, m, of the primary element is much less than the mass, M, of the secondary element. Further the length of arm 230 is longer than arm 225. In further embodiments, these relationships may be varied significantly, and even reversed if desired to provide different characteristics.

While the MEMS elements have been described as masses on the ends of cantilevers, the MEMS elements may be varied in shape and size significantly. In one embodiment, the primary element 215 and arm 230 may be coupled to a different type of secondary element 210 or resonator, such as a dome resonator, that operates to provide force to the primary element. Element 210 is in block form and is representative of such other types of elements. A cantilever may be coupled to a dome resonator. In further embodiments, even larger numbers of displacement structures may be coupled to provide an increase in the displacement of the primary MEMS element.

MEMS devices may vary greatly in size, and are generally as large as millimeter range feature sizes to nanometer range feature sizes.

In one embodiment, a vertical comb drive actuator 210 supported by torsion springs 225 forms the secondary MEMS element. Bonded or attached using processes well established in MEMS fabrication, to this structure is a low mass cantilevered MEMS mirror 215 which forms the primary MEMS element from which large displacements are desired. The resonance frequency of the comb drive actuator is designed to match that of the cantilevered MEMS mirror. A sinusoidal voltage applied between the fixed and moving combs generates an attractive force between them and torques the actuator mass by twisting it around the torsion springs. If the voltage signal is applied at a frequency which matches the resonant frequency of both the actuator and MEMS mirror, small deflections in the actuator will result in very large displacements in the cantilevered mirror.

In another embodiment, a cantilever MEMS actuator, which may be made of silicon/$SiO_2$ or polymer on which a current loop has been fabricated and placed in a magnetic field, or a cantilever made of a ferromagnetic material placed between current carrying coils/wires, a cantilever made from or coated with piezoelectric/ferroelectric/magnetostrictive materials. To such an actuator, another MEMS cantilever, or suspended mass structure such as the elements of a MEMS accelerometer or gyroscope is attached. Both actuator and the attached MEMS element are designed to share the same resonant frequency. Vibrations generated at this frequency by the actuator through an applied voltage/current signal will result in very large displacements in the MEMS even for small displacements in the actuator.

As a means to eliminate/diminish displacements caused by unwanted modes of resonance in a MEMS structure, one or more vibration absorbing secondary structures may be attached and tuned to the frequency of the unwanted resonance mode.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A microelectromechanical structure (MEMS) device comprising:
   a secondary cantilever MEMS element displaceably coupled to a substrate; and
   a primary cantilever MEMS element displaceably coupled to the secondary cantilever MEMS element and having a resonant frequency substantially equal to the secondary cantilever MEMS element and having a much larger displacement than the secondary cantilever MEMS element.

2. The device of claim 1 wherein the primary cantilever MEMS element comprises a primary element of mass, m, supported by a primary arm with spring constant, k, coupled to the secondary cantilever MEMS element.

3. The device of claim 2 wherein the secondary cantilever MEMS element comprises a secondary element of mass, M, supported by a secondary arm with spring constant, K, coupled to the substrate.

4. The device of claim 3 wherein the primary arm is longer than the secondary arm.

5. The device of claim 3 wherein the primary arm is coupled to the secondary element.

6. The device of claim 3 wherein k/m is approximately equal to K/M.

7. The device of claim 6 wherein m is less than M.

8. A microelectromechanical structure (MEMS) device comprising:
   a secondary cantilever MEMS resonator coupled to a substrate; and
   a primary cantilever MEMS resonator coupled to the secondary cantilever MEMS resonator and having a resonant frequency substantially equal to the secondary cantilever MEMS resonator, wherein the primary cantilever MEMS resonator is coupled to the secondary cantilever MEMS resonator to provide a much larger displacement than the secondary cantilever MEMS resonator.

9. The device of claim 8 wherein the primary cantilever MEMS resonator comprises a primary element of mass, m, supported by a primary arm with spring constant, k, coupled to the secondary cantilever MEMS resonator and wherein the secondary cantilever MEMS resonator comprises a secondary element of mass, M, supported by a secondary arm with spring constant, K, coupled to the substrate.

10. The device of claim 9 wherein the primary arm is longer than the secondary arm and wherein the primary arm is coupled to the secondary element.

11. The device of claim 9 wherein k/m is approximately equal to K/M and wherein m is less than M.

12. A method comprising:
    subjecting a secondary cantilever MEMS resonator that is coupled to a substrate to a source of energy to cause it to vibrate at a resonant frequency; and
    causing a primary cantilever MEMS resonator coupled to the secondary cantilever MEMS resonator to vibrate at the resonant frequency, wherein both the primary and secondary cantilever MEMS resonators have approximately the same resonant frequency.

13. The method of claim 12 wherein the secondary cantilever MEMS resonator ceases vibrating with most of the vibration energy being applied to the primary cantilever MEMS resonator increasing a vibration displacement of the primary cantilever MEMS resonator in response to the source of energy.

14. The method of claim 12 wherein the primary cantilever MEMS resonator has a mass less than a mass of the secondary cantilever MEMS resonator.

15. The method of claim 12 wherein the source of energy is applied to the secondary cantilever MEMS resonator by at least one of piezoelectric, electrostatic, electromagnetic, and thermal actuation.

16. The method of claim 15 wherein the source of energy has a frequency at or near the resonant frequency of the cantilever MEMS resonators.

* * * * *